United States Patent [19]

Kudlich

[11] 4,010,320
[45] Mar. 1, 1977

[54] DRUM RECORDING MEANS WITH DUAL SCANNING HEADS

[75] Inventor: Hans Kudlich, Kufstein, Austria

[73] Assignee: Schablonen Technik Kufstein Ges.m.b.H., Kufstein-Schaftenau, Austria

[22] Filed: July 25, 1975

[21] Appl. No.: 599,054

Related U.S. Application Data

[63] Continuation-in-part of Ser. No. 402,826, Oct. 2, 1973, abandoned.

[30] Foreign Application Priority Data

Oct. 6, 1972  Austria .............................. 8630/72

[52] U.S. Cl. .............................. 358/289; 346/138; 274/22; 358/287; 358/297
[51] Int. Cl.² .......................................... H04N 1/06
[58] Field of Search .......... 178/6.7 R, 6.6 R, 6.6 B, 178/7.4; 250/566; 346/139 A, 125, 138; 360/87; 274/17, 18, 22

[56] References Cited

UNITED STATES PATENTS

| | | | |
|---|---|---|---|
| 2,989,586 | 6/1961 | Beck | 346/139 A |
| 3,037,074 | 5/1962 | Foll | 178/6.7 R |
| 3,541,245 | 11/1970 | Wilby | 178/67 R |
| 3,770,888 | 11/1973 | De Vos | 178/6.6 B |
| 3,784,739 | 1/1974 | De Vos | 178/6.6 B |

*Primary Examiner*—Bernard Konick
*Assistant Examiner*—Alan Faber
*Attorney, Agent, or Firm*—Ernest G. Montague; Karl F. Ross; Herbert Dubno

[57] ABSTRACT

An apparatus for reproducing a pattern on a recording medium has a master cylinder adapted to carry the pattern and a copy cylinder adapted to carry the recording medium. A main drive motor is connected to both the cylinders for continuously and jointly rotating them about their respective axes. First and second reader leadscrews, parallel to the master cylinder carry first and second reading means, respectively, which scan the pattern on this master cylinder along a first set of helixes. A scriber is carried on another leadscrew parallel to the copy cylinder and is connected to the reader for replicating the pattern at least once in each of a plurality of axially adjoining sections on the cylinder by marking the medium on the cylinder along a second helix extending over all of the sections. The main drive motor is connected to the main input of a differential gear train whose output is operatively connected to the first and second reader leadscrews. An auxiliary drive means is connected to an auxiliary input of this differential gear train and is effective in one operational mode to axially displace a reading means in one direction relative to the master cylinder and in another operational mode to axially displace it in the opposite direction. This auxiliary drive means is operated only to return the scanner to its starting position at the beginning of the pattern. Thus, a reading means which has completed its scan of the master cylinder is rapidly returned to its starting position while the other reading means scans the master cylinder; i.e. the master cylinder is continuously scanned.

7 Claims, 13 Drawing Figures

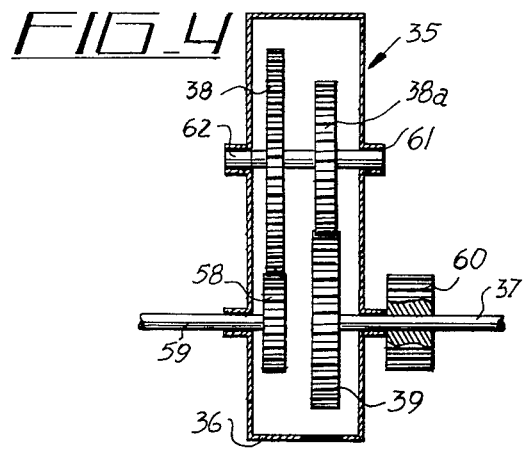
FIG_4
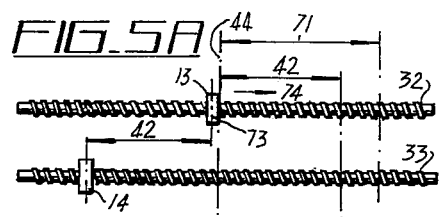
FIG.5A
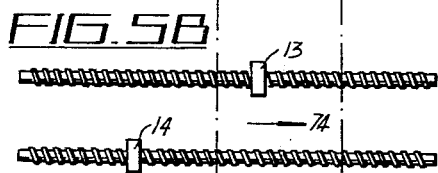
FIG.5B
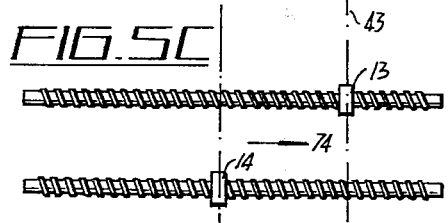
FIG.5C
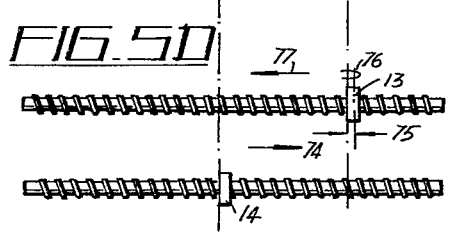
FIG.5D
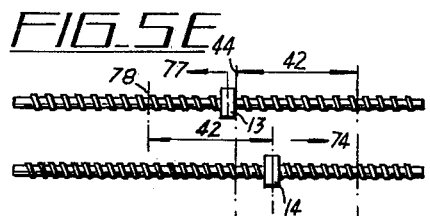
FIG.5E
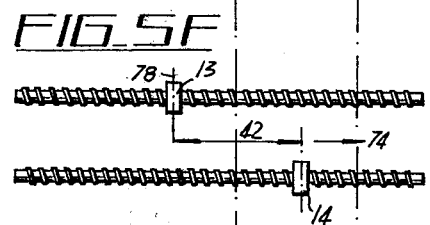
FIG.5F
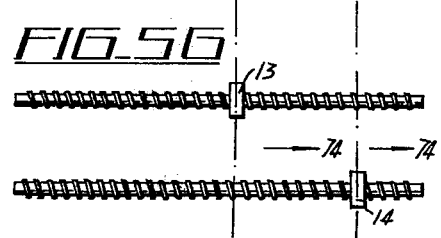
FIG.5G
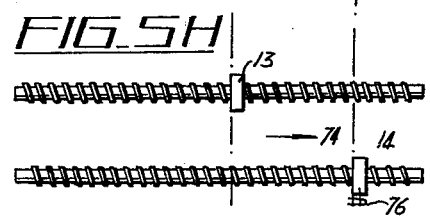
FIG.5H

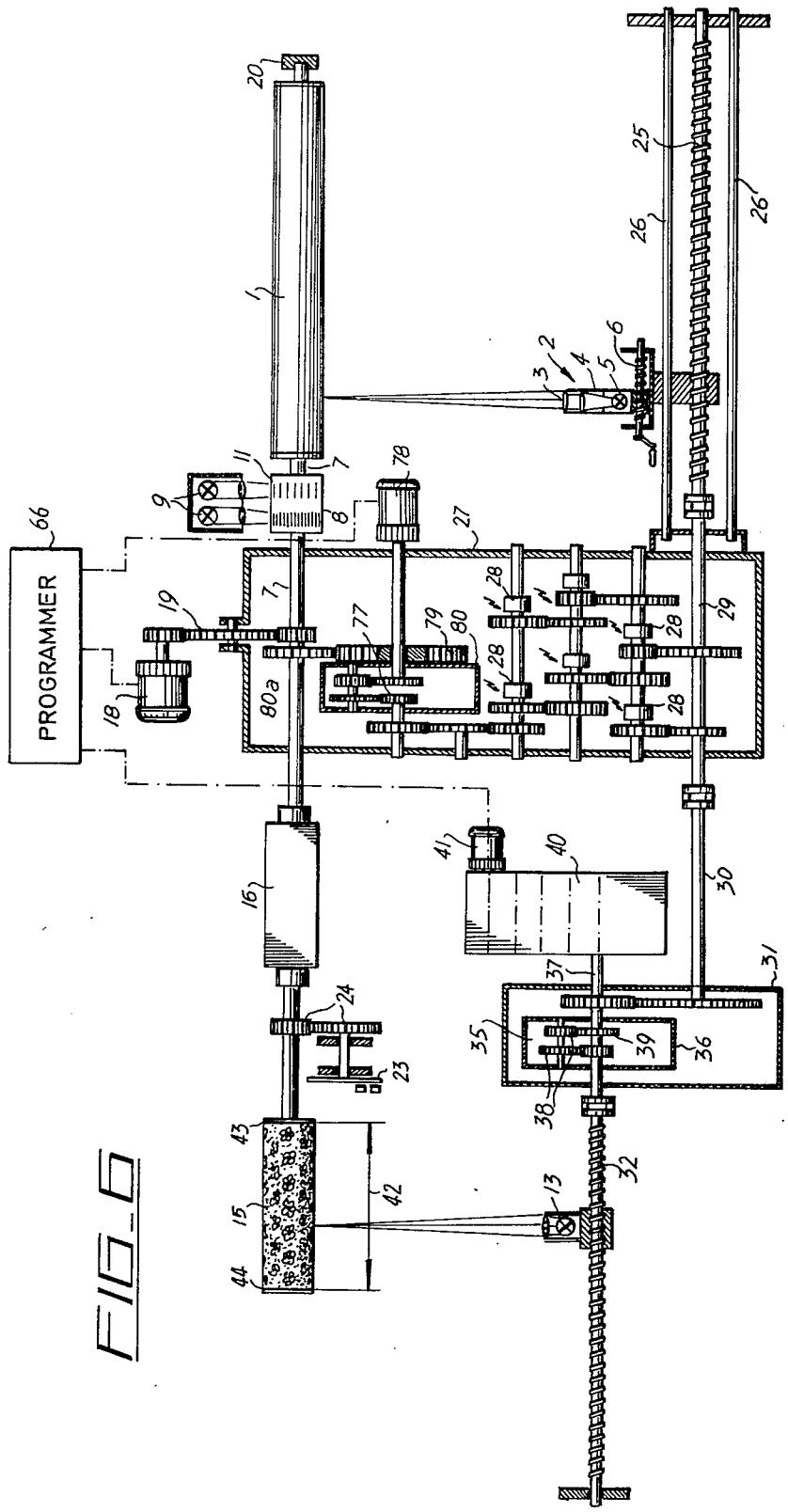

4,010,320

DRUM RECORDING MEANS WITH DUAL SCANNING HEADS

CROSS REFERENCE TO RELATED APPLICATION

This application is a continuation-in-part of my copending patent application Ser. No. 402,826, filed Oct. 2, 1963, now abandoned.

FIELD OF THE INVENTION

The present invention relates to an apparatus for reproducing a pattern on a recording medium. More particularly this invention concerns such an apparatus which replicates a pattern carried on a master cylinder in each of a plurality of axially adjoining zones on a copy cylinder.

BACKGROUND OF THE INVENTION

In the production of wallpaper, textiles, and the like a printing roller is usually employed on which a pattern is printed, frequently in a plurality of adjoining bands on the printing cylinder. Such a cylinder is used for the transfer of dye or ink to the textile or paper being printed.

Such a printing roller is produced by photoengraving a nickel-plated steel cylinder with the desired pattern. Typically a light-sensitive reproducing medium is applied to the cylinder and the pattern is scribed in this cylinder with a light beam controlled by a pattern scanner. The pattern is carried usually on a master cylinder and it is known to scan the master cylinder and scribe on the copy cylinder simultaneously by displacing the scanner and the scriber each axially along the respective cylinder as this cylinder is rotated so that both scanning and scribing follow respective helices.

With such systems it is very difficult to reproduce the pattern a succession of times on the copy cylinder. The best methods for doing this involve complicated electronic installations that store the entire pattern and then allow it to be used again, or involve considerable manual labor for setting the arrangement up. In addition it is also frequently desired to shift each band of the pattern relative to the adjacent band so that an artistically pleasing array is produced.

The known systems, thus, are all relatively complicated. It is therefore only possible to use such systems when large-scale production is envisaged, as production costs for producing the printing cylinder are extremely high.

OBJECTS OF THE INVENTION

It is therefore an object of the present invention to provide an improved pattern reproducing system.

Another object is the provision of such an apparatus which can reproduce a pattern several times on a recording medium.

Yet another object is to provide an apparatus which inexpensively and simply reproduces a pattern from a master cylinder on a plurality of axially adjoining sections or zones of a copy cylinder.

Yet another object is to provide a system which is easy to set up and which can function automatically.

SUMMARY OF THE INVENTION

These objects are attained according to the present invention in an apparatus of the above-described general type having a main drive connected to the master cylinder carrying the pattern and the copy cylinder carrying the recording medium that continuously and jointly rotates these cylinders about their axes. Reading means is axially displaceable along the master cylinder on a reader leadscrew and scribing means connected to the reading means is axially displaceable along the copy cylinder on a respective scriber leadscrew so that the reading means will scan the pattern on the master cylinder in a first helix and the scribing means will replicate the pattern at least once in each of the sections on the copy cylinder by marking the reproducing medium on the copy cylinder along a second helix extending over all of the axially joining zones. A scriber transmission is provided which operatively connects the scriber leadscrew with the main drive means for axially displacing the scriber means by means of the main drive means. A reader transmission is also provided having a differential gear train with an output connected to the reader leadscrew, a main input operatively connected to the main drive means, and an auxiliary input connected to auxiliary drive means separate from the main drive means and effective in one operational mode for axially displacing the reader means at a predetermined rate in a reverse direction and in another operational mode for axially displacing the reader means in the opposite direction.

Thus with the system according to the present invention the main drive is continuously effective to jointly and synchronously rotate both the master cylinder and the copy cylinder. The pattern, which has an axial length that is only a fraction of the axial length of the copy cylinder, and which corresponds to the length of each of the zones adapted to receive a replica of this pattern on the cylinder, can be reproduced several times in a very simple fashion. The necessity of shutting down the whole device and carefully repositioning the reading means is eliminated by the provision of the auxiliary drive which rapidly and automatically resets the reading means completely independently of the main drive means which, therefore, continues to synchronously rotate the two cylinders.

According to the present invention two such reading means each carried on a respective reader leadscrew and operable through a respective reader transmission having a respective auxiliary drive are provided. In this type of arrangement the scribing of the pattern in the adjoining zones of the copy cylinder is continuous, as one after the other scanning head is employed, with the downstream head being displaced back upstream by the respective auxiliary drive means once it reaches the downstream end of the pattern.

In accordance with this invention the differential gear train comprises a planetary gear system having a planet carrier provided with a driving pinion constituting the main input, a driving sun gear provided with an input shaft connected to the auxiliary drive means and constituting the auxiliary input, a driven sun gear coaxial with the driving sun gear and provided with an output shaft constituting the output, and a pair of positively interconnected planet gears on the carrier respectively meshing with the sun gears. Such a transmission may in accordance with this invention be provided between the main drive and the main input for the reader transmission and the scriber so that the scriber may be arrested along with the main input of the reader transmission as the auxiliary drive is operated to return the reader head to its starting position at the upstream end of the pattern.

According to yet another feature of this invention the reader produces an output that is recorded as an electrical signal on a magnetic memory disk rotated synchronously with the pattern. Several adjustable pickup heads adjacent this disk allow the pattern signal to be picked up at different angular positions so that shifting of the pattern from one band to the next can be carried by very simple means electronically simply by switching from one pickup head to the other as zones are changed.

Thus with the system according to the present invention a very simple arrangement is provided which can be set up even by a relatively unskilled worker so as to produce a copy roller on which a pattern is reproduced a plurality of times. Thus it is possible even in small operations to manufacture printing rollers which can be used for the small-scale production of textiles, wallpaper and the like.

BRIEF DESCRIPTION OF THE DRAWING

The above and other objects, features and advantages will become more readily apparent from the following, reference being made to the accompanying drawing in which:

FIG. 4 is a cross section showing a detail of FIG. 1, FIGS. 5A–5H illustrate operation of the scanning system according to the present invention, and FIG. 6 is a view similar to FIG. 1 illustrating another system according to the present invention.

SPECIFIC DESCRIPTION

Figure 1:
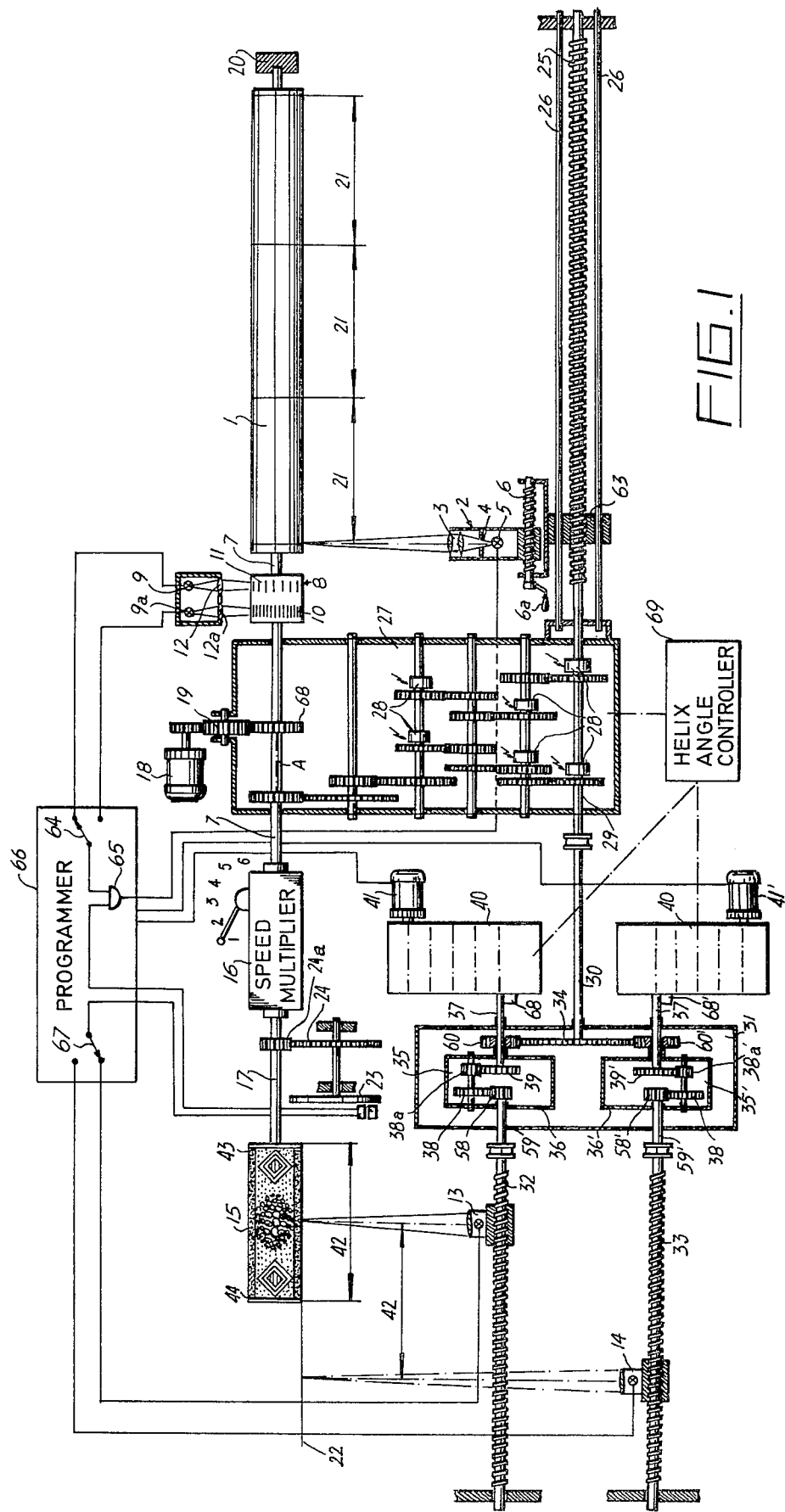
FIG. 1 is a schematic general view of the apparatus according to the invention.

The apparatus according to the present invention as shown in FIG. 1 employs a matrix or copy roller 1. This roller 1 is perfectly cylindrical and covered with a bright nickel plating 0.1 mm thick. A chemical-resist photosensitive resin layer is applied thereover, a diazoresin being employed here, covered by a light-sensitive layer of silver halides. This latter layer is composed of a gelatin emulsion in which is imbedded silver chlorides, silver bromides, and, if desired, silver iodides, and this emulsion is not hardened. After a spot or linear exposure of a pattern on the roller 1 so coated the gelatin emulsion is developed. This emulsion is then fixed so that the diazoresin layer underneath it disintegrates, using an ultraviolet exciter lamp in areas that are not blacked. Subsequently the unhardened gelatin layer is washed off with warm water. The diazoresin may then be processed in an alkaline bath so that it is washed out where exposed to produce a printing roller from which wallpaper or the like may be produced.

The copy roller 1 according to the present invention is irradiated along a helical line by an exposure unit 2 formed of a focusing lens system 3, a diapositive 4 formed with an aperture like a shutter, and a light source 5 in the form of a gas-discharge tube such as is used in a flash gun or stroboscope. The light source 5 is operated to generate short flashes of light lasting approximately 1 microsecond. In this manner the unit 2 periodically casts on to the surface of the drum 1 a bright spot of light which has a shape defined by the shutter-diapositive 4 and which is sharply focused by means of the lens system 3. The entire housing of this unit 2 is mounted on a carriage 63 and is displaceable thereon in the direction of an axis A of the apparatus by means of a spindle 6 having a hand wheel 6a allowing axial displacement of this unit 2 so as to position it exactly relative to the roller 1.

The flashing rate of this unit 2 is controlled by means of a cylindrical drum 8 carried on the shaft 7 lying on the axis A upon which the roller 1 is mounted so that the drum 8 and the roller 1 rotate together. This roller 8 is provided with two sets of angularly equispaced markings or indicia 10 and 11 each of which is arranged in a circumferential angularly equispaced row and each of which is detectable through a respective lens 12 and 12a by means of a respective photocell 9 and 9a. The output of one of these photocells is fed through a switch 64 and an AND gate 65 of a controller or programmer 66 back to the light source 5 and causes it to flash at a rate dependent on the angular spacings of the markings 10 and 11. As is clearly shown in FIG. 1 the markings 11 are approximately twice as far apart angularly as the markings 10, so that when the respective photocell 9 is employed a much coarser pattern will be reproduced than when the markings 10 are used. Each time a respective marking passes under the photocell which is connected by means of the switch 64 a pulse may be fed through the AND gate 65 to the light source 5 so as to operate this source and cast a spot of light onto the surface of the roll 1. It is possible to provide many such rows of markings on the drum 8, each with its respective photocell.

On the end of the axial shaft 7 opposite the roller 1, which itself is secured in place by means of a removable journal 20, is a speed-multiplying transmission 16 having an output 17 also lying on the axis A and carrying a master roller 15 on which is drawn or printed a master pattern to be reproduced. The multiplier transmission 16 drives the output shaft 17 at a rate which is whole-number multiple of the rate of rotation of the input shaft 7. A six-position adjustment lever 16a is displaceable to give transmission ratios of between 1:1 and 1:6. The master pattern on the roll 15 may be scanned by either of two photocells devices 13 and 14 described below whose outputs are fed to a switch 67 of the programmer 66 and thence through a memory-storage disk 23 to the AND gat 65. In this manner a pulse will only be fed by the AND gate 65 to the strobe light 5 when the switched-in photocell 9 or 9a reads a marking 10 or 11 and the switched-in photocell device 13 or 14 reads a dark spot on the pattern roller 15.

The pattern on the master roller 15 is either a single design which extends completely around this roller 15, or a design which is repeated several times, nonetheless leaving no irregular blank zones on the roller 15. In most situations a single or double pattern is used. It is frequently desired to print this pattern at separate axially adjoining sections or zones 21 on the copy roller 1. At the same time it is also typically desired to angularly offset the pattern in each of the zones 21 from the pattern in the adjacent zone 21, creating a so-called shift or semishift. This is effected as will be described below with reference to FIG. 3 by temporarily storing the output of the photocell devices 13 and 14 on the magnetic storage disk 23.

The size of the spot of light generated by the exposure unit 2 is such that, even when a fine raster 10 is used the spots do not overlap one another, leaving spaces between them. In accordance with this invention the shutter or diapositive 4 is of hexagonal outline and, after exposure of the roll 1, a stencil with a network of hexagonal holes is laid over the rolls so as to helically join the individual points around the pattern. Every other row is shifted by one turn of the helix resulting by displacement of the carriage 63 along tie rods 26 by means of a threaded leadscrew 25.

An electric motor 18 continuously drives a gear 19 meshing with another gear 88 carried on the shaft 7 so that this shaft 7 always rotates at the same rotary speed. The shaft 7 constitutes the input of an eight-speed transmission 27 having an output shaft 29 connected to the leadscrew 25. Six electrical clutches 28 provided in the transmisson 27 allow a selection of eight different rotary speeds at the output shaft 29, given the continuously rotating constant-speed input at shaft 7. Thus eight different pitch angles can be obtained for the helix scribed by the unit 2 carried by the leadscrew 25, depending on the setting of the transmission 27.

As also show in FIG. 1 another transmission 31 has an input gear 35 carried on a shaft 30 rigidly coupled to the output shaft 29 of the transmisson 27. This transmission 31 has, in addition to its main input 30, a pair of auxiliary input shafts 37 and 37' connected via respective transmissons 40 and 40' to respective drive motors 41 and 41' both themselves connected to the programmer 66. The transmissions 40 are identical to the transmission 27, but are less robustly built as the torque needed at the shafts 37 and 37'is considerably less than that needed at the output shaft 29. The transmission 31 includes two transmissions 35 and 35' of identical construction and each connected to a respective output shaft 32 and 33 formed as the leadscrews carrying the photocell devices 13 and 14, respectively.

As shown in more detail in FIG. 4 the transmission 35, identical to the transmission 35' to which identical primed reference numerals are applied, is of the planetary-gear type and has an input gear 60 meshing with the main drive gear 34 of the transmission 31 and rigidly connected to the planetary carrier 36 of the transmission 35. Journaled in this carrier 36 at 61 is a shaft 62 on which is rigidly connected a pair of planet gears 38 and 38a meshing with respective sun gears 58 and 39 carried on the shafts 59 and 37, respectively. The gears 34 and 60 are dimensioned such that absent rotation of the ancillary or auxiliary input shafts 37 and 37' the output shafts 59 and 59' of the transmission 31 will rotate at twice the rotary speed of the main input shaft 30 of this transmission 31. Since the pitch of the leadscrew 25 is twice as steep as the pitch of the leadscrew 32 and 33 carried on the output transmissions 59 and 59' the photocell devices 13 and 14 carried thereby will move at exactly the same axial rate of speed as the exposure unit 2. A helix angle controller 69 is provided connected to the magnetic clutches 28 of the transmission 27 and to the corresponding units of the transmissions 40 and 40'. In addition the several motors 41 and 41' are operated at the same rate as the shaft 7, so that the rotary speed of the shafts 37 and 37' can be identical to that of the shaft 30.

The gear 58 has 20 teeth, and the gear 38 has twice as many, or 40 teeth. Similarly the pinion or gear 38a has only 30 teeth as does the gear 39. Thus the shaft 59 will rotate at twice the rotary speed as the shaft 37 if the gear 60 is not rotated. When this gear 60 is rotated, however, the output shaft 59 will rotate at a speed that is twice that of the rotary speed of shaft 37. When the shaft 37 is stopped, and only the gear 60 is rotated, the shaft 59 is rotated, the shaft 59 will run at the same rotary speed as the gear 60, but in the opposite direction.

Figure 2:
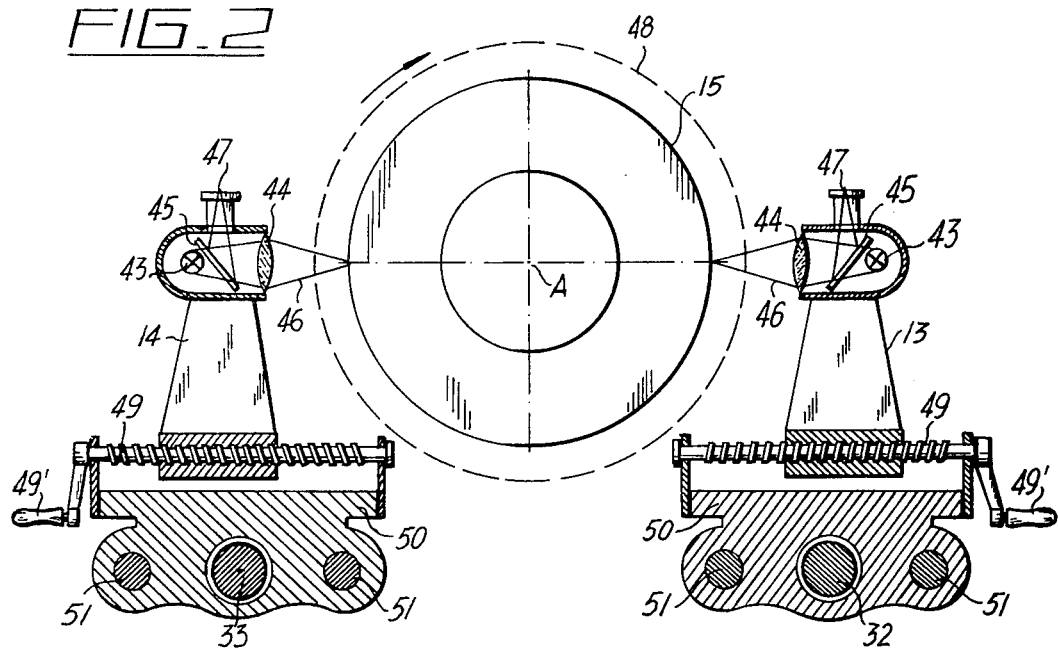
FIG. 2 is a vertical section of a portion of the system of FIG. 1.

FIG. 2 shows in more detail the photocell scanners 13 and 14. It can be seen that each of these comprises a photocell 43 focusable through a tilted semitransparent mirror 45 by a lens 44 which is focused as shown in FIG. 2, on the surface of the drum 15 which may have a maximum diameter as great as the dashed-line circle shown at 48. In addition each of these devices 13 and 14 is provided with a viewing eyepiece 47 and with an adjustment leadscrew 49 that allows the photoelectric device 13 or 14 to be displaced transversely to the axis A on a carriage 50. Each of the leadscrews 32 and 33 is threadedly engaged with a respective carriage 50 that is also carried on polished guide rods 51 parallel to the axis A. Thus the user focuses the devices 13 and 14 on the surface of the drum 15 by observing through the eyepiece 47 and adjusting the respective leadscrew 49 by means of its crank 49'.

Figure 3:
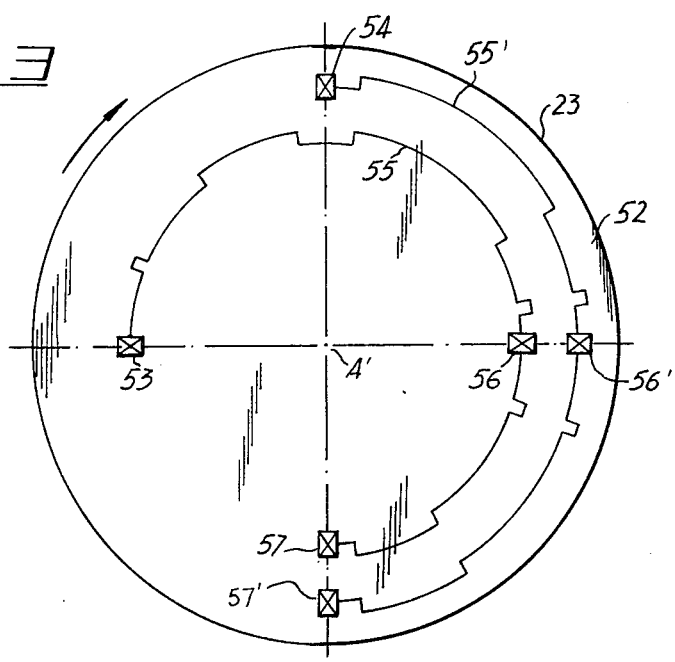
FIG. 3 is a diagrammatic elevational view of a magnetic memory device for the apparatus of FIG. 1.

As shown in FIG. 3 the magnetic storage plate 23 is adapted to record the dark-light signals obtained by the scan or read heads 13 and 14. This memory 23 consists of a magnetizable plate 52 which is rotated by means of gears 24 about an axis A' parallel to the axis A and at a rotary speed which is exactly half of the speed of the copy roll 15. The angular offset of the read heads 13 and 14 is 180° relative to the axis A' and is an angular distance of 90° on the disk 52. The signal output from the scanner 13 is fed to a write head 53 adjacent the disk 52 and the signal from the scanner 14 to a head 54 also adjacent the disk 52. The head 54 is radially offset from the head 53 relative to the axis A' of the disk 52 and is also angularly offset by a distance of 90° from this head 53. The output signals, in digital form, are therefore recorded as traces 55 starting at the respective heads 53 and 54. Downstream by 90° from the downstream heads 53 and 54 or and over each trace is a respective reader head 56 and 56' and 90° further downstream is another pair of reader heads 57 and 57'.

The computer-type programmer 66 is set up so as to count the pulses coming in from photocells 9 and 9a or to detect special markings on the drum 8 so as to know when a full revolution of the drum 1 has taken place. In this manner the programmer 66 is able to calculate when the end of each section 21 is reached. Since, as shown in FIGS. 1 and 6, the photocell units are spaced apart by a distance 42 equal to the length between the beginning of 44 and the end 43 of the pattern, with these photocells focused on a generatrix or line on the surface of the drum 15, it is possible for the programmer to know when to switch over from the photocell 13 to the photocell 14 and vice versa. The distance 42 is equally divisible by the pitch of the helix traced by the light spot generated by the exposure unit 2 on the drum 1. The spindles 32 and 33 are more than twice as long as the distance 42.

Thus according to the present invention the heads 13 and 14 can be operated alternately, with the programmer automatically switching from the head 13 to the head 14 when the head 13 has reached the downstream end 43 of the pattern and the head 14 reaches the upstream end 44 thereof. If the pattern is not to be shifted between one zone 21 and the adjoining zone 21 the two reading heads 56 and 56' and the two reading heads 57 and 57' are used together. If there is, however, to be a shift, each time the programmer 66 switches over from one scanner it similarly switches over from one of the heads 56 or 56' to the other head 57 or 57'. This effects an offset in the pattern from zone 21 to zone 21 equal to 180°, here the annular width of the pattern on the roller 15. If it is desired to produce the pattern more than once on each section 21 of the roller the transmission 16 is set so as to rotate the roller 15 at a whole-number multiple of the rotary speed of the roller 1, thereby angularly compressing the pattern on the surface of the roller 1.

The switchover by the computer 66 can, with conventional semiconductor circuitry, be effected in a time span equal to 1/1000 the time of the interval between two successive marks on the cylinder 8.

After the downstream scanner 13 has reached the downstream end 43 of the pattern the programmer 66 switches over to the upstream head 44 and the servomotor 41 for the head 13 is operated in reverse fashion so as to displace the head back until it is upstream of the head 14 by the distance 42. This is done by first operating the motor 41 at high speed, between 2000 rpm and 3000 rpm, except for the last 10 turns of the screw 32, when it is operated at a slower speed between 200 rpm and 300 rpm. In this manner the total return or reposition time takes about twenty percent of the time necessary for exposing and reading the width of one pattern. FIGS. 5A–5H illustrate the operation of the system according to this invention in detail.

FIG. 5A shows how the heads of 13 and 14 are normally set up, spaced apart in the direction of axis A by the distance of 42. The number of revolutions of the shaft 32 or 33 necessary to move the respective heads 13 and 14 through the distance 42 is stored in the programmer 66. The distance 71 indicates the maximum possible pattern length for the apparatus according to the present invention. As soon as the center 73 of the head 13 reaches the starting end 44 of the pattern 5 the reading operation begins, with a signal from the head 13 being transformed into the trace 55 which is read off by the head 56. Both of the motors 41 and 41' are stopped and brakes 68 and 68' on the shafts 37 and 37', respectively, are locked in place. Each of these brakes 68 and 68' comprises a simple pawl which can fit into a single radial open notch in the respective shaft 37 or 37' so as to define an angularly precise rest position for the shafts 37 and 37'. As described above the rotation rates of the leadscrews 32 and 33 is double that of the leadscrew 25 as a result of the dimensioning of the gears 34 and 60. This displaces the two heads 13 and 14 in the direction of arrow 74.

FIG. 5B shows how the two heads or scanners 13 and 14 will move jointly, but the signal from scanner 13 alone is used by the programmer 66 and applied to the AND gate 65 to the xenon tube 5.

When, as shown in FIG. 5C the downstream scanner 13 reaches the downstream end 43 of the pattern, the upstream scanner 14 will automatically reach the upstream end of the pattern. The trace 55'which the scanner 14 has been forming on the disk 52 is now read off either by the head 56' when there is to be no shift between adjacent regions 21, or by the head 57' if there is to be such a shift.

As shown in FIG. 5D the downstream head 13 is allowed to move through a distance 75 equal to the pitch of the screw 32 past the downstream end 43 of the pattern 15. The programmer 66 then actuates the motor 41 and releases the brake 68. The motor 41 is operated at high speed for a number of revolutions equal to 10 less than the requisite number to displace the scanner 13 back in the direction of arrow 77 equal to the distance 42. For the last 10 revolutions a slow speed is employed.

FIG. 5E shows how the head 13 is displaced all the way back past the beginning of pattern 44 and is displaced, as shown in FIG. 5F to a position 78 exactly upstream of the head 14 by the distance 42. As soon as this position 78 is obtained the motor 41 is instantaneously arrested and the brake 68 is locked in so that the two heads will then continue to move in the direction of arrow 74 at the same exact speed and spaced apart by the distance 42.

Thereupon as shown in FIG. 5G the computer 66 automatically switches from the trace 55' of the scanner 14 to the trace 55 of the scanner 13, by connecting back to the head 56. FIG. 5H shows how then the scanner 14 is reversed in the same manner as the head 13 was reversed in FIG. 5D.

Reference numerals identical to those in FIGS. 1 through 5H are employed in FIG. 6 where structure is identical. Here, however, the transmisson 35' and scanner 14 have been eliminated. This is made possible by provision of an intermediate transmission 77 between the continuously operating motor 18 and the transmisson 27.

An adjustment motor 78 is provided which is connected to a sun gear of the planetary-gear transmission 77. A pinion gear 80a carried on the shaft 7 meshes with the gear 79 carried on the planet carrier 80 of the transmission 77, with the gears 79 and 80a in 1:1 relationship. The motor 78 is operated so as never to deliver less than half of a revolution into the transmission 77.

Thus the programmer 66 stores the information concerning the number of revolutions of the motors 18 and 41 to displace the head 13 through the distance 42. When the scanner 13 is focused at the extreme downstream end of the master roller 15 the motor 78 is actuated so as to arrest the rotary displacement of the output shaft 29 to stop the exposure unit 2 and the scanning head 13. Then the motor 41 is operated to return the scanning head 13 to its starting position and the motor 78 is switched off so as to sweep the master roller 15 again and continue the scribing with the exposure unit 2 in the next zone on the copy roller 1 carrying the recoding medium. The motors 18, 41 and 78 are all of the synchronous variety and their operations are all controlled very carefully so that the above-described operations all take place when the motors are in predetermined angular positions relative to each other. It is noted once again that markings on the drum 8 may be employed to trigger the operation of the motors 78 and 41.

Although the invention described above employs simple optical scanning of the pattern roller 15 and photographic-type exposure of the copy roller 1, it is possible to use many other types of systems. For instance a laser scribing of the roller 1 may be employed as well as simple physical machining. Similarly the scanner 13 can be replaced by a device which senses a pattern made in holes on the roller 15 or which is similarly reproduced thereon.

I claim:

1. An apparatus for reproducing a pattern on a recording medium, said apparatus comprising:
   a master cylinder adapted to carry said pattern and having an axis;
   a copy cylinder adapted to carry said recording medium and having an axis, said copy cylinder being subdivided into a plurality of axially adjoining zones each adapted to receive a replica of said pattern;

main drive means connected to both of said cylinders for continuously jointly rotating same about their respective axes;

reading means including first and second reading heads axially spaced and axially displaceable along said master cylinder in a forward direction for scanning said pattern along a respective first set of helixes;

scribing means connected to said reading means and axially displaceable along said copy cylinder for replicating said pattern at least once in each of said zones by marking said medium along a second helix extending over all of said zones;

a first reader leadscrew parallel to the axis of said master cylinder and coupled with said first reading head for displacing same;

a first reader transmission means having a differential gear train with an output operatively connected to said first reader leadscrew, a main input operatively connected to said main drive means, and an auxiliary input;

auxiliary drive means coupled with said auxiliary input and effective in one operational mode for axially displacing said reader means at a predetermined rate in a reverse direction opposite said forward direction;

a scriber leadscrew parallel to the axis of said copy cylinder coupled with said scribing means for displacing same;

scriber transmission means operatively connecting said scriber leadscrew with said main drive means for axially displacing said scriber means with said drive means;

a second such reader leadscrew adjacent and parallel to the first-mentioned reader leadscrew;

a second such reader transmission means having a differential gear train with an output operatively connected to said second reader leadscrew, a main input operatively connected to said main drive means, and an auxiliary input; said second reading head being driven by said second reader leadscrew, said auxiliary drive means including first and second servomotors respectively connected to the auxiliary inputs of said first and second reader transmission means; and switching means for alternately connecting said reading heads to said scribing means and for alternately operating said motors to drive the head not connected to said scribing means in said reverse direction at a speed in excess of its speed in said forward direction to restore the axial spacing of said reading heads for further displacement thereof in said forward direction.

2. The apparatus defined in claim 1, futher comprising speed-changing means inserted between said main drive means and one of said cylinders for rotating said master cylinder at a multiple of the rotary speed of said copy cylinder.

3. The apparatus defined in claim 1 wherein each of said differential-gear train comprises a planet carrier provided with a driving pinion constituting said main input, a driving sun gear provided with an input shaft connected to said auxiliary drive means and constituting said auxiliary input, a driven sun gear coaxial with said driving sun gear and provided with an output shaft, and a pair of positively interconnected planet gears on said carrier respectively meshing with said sun gears.

4. The apparatus defined in claim 3 wherein said input shaft is positively connected with said scriber leadscrew.

5. A device as defined in claim 1, further comprising rotatable storage means synchronized with said master cylinder, a pair of writing heads respectively connected to said reading heads for registering output signals from the latter on corresponding tracks of said storage means, and a pair of pick-up heads for retrieving the registered signals from said tracks for transmission to said scriber means.

6. A device as defined in claim 1 wherein said scriber transmission means includes a scriber differential-gear train having a main input coupled with said main drive means for continuous rotation thereby, and an output coupled with said scriber leadscrew.

7. A device as defined in claim 6 wherein said main input of each of said reader differential-gear train is coupled with said main drive means through said scriber differential-gear train is parallel with said scriber leadscrew.

* * * * *